US011631675B2

(12) United States Patent
Wang et al.

(10) Patent No.: US 11,631,675 B2
(45) Date of Patent: Apr. 18, 2023

(54) SEMICONDUCTOR MEMORY STRUCTURE AND METHOD FOR FORMING THE SAME

(71) Applicant: Winbond Electronics Corp., Taichung (TW)

(72) Inventors: Yu-Po Wang, Pingtung (TW); Yi-Hao Chien, Taichung (TW); Hsiang-Po Liu, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 17/160,871

(22) Filed: Jan. 28, 2021

(65) Prior Publication Data

US 2022/0238526 A1 Jul. 28, 2022

(51) Int. Cl.
*H01L 27/108* (2006.01)
*H01L 29/06* (2006.01)

(52) U.S. Cl.
CPC .... *H01L 27/10805* (2013.01); *H01L 27/1087* (2013.01); *H01L 29/0653* (2013.01)

(58) Field of Classification Search
None
See application file for complete search history.

(56) References Cited

U.S. PATENT DOCUMENTS

| 10,332,887 | B2 | 6/2019 | Chang et al. | |
|---|---|---|---|---|
| 2003/0178662 | A1* | 9/2003 | Voigt | H01L 27/10841 |
| | | | | 257/E21.655 |
| 2019/0157132 | A1* | 5/2019 | Nagai | H01L 29/0649 |

FOREIGN PATENT DOCUMENTS

| TW | 201007930 A | 2/2010 |
|---|---|---|
| TW | 201635443 A | 10/2016 |

* cited by examiner

*Primary Examiner* — Nicholas J Tobergte
*Assistant Examiner* — Kevin Quinto
(74) *Attorney, Agent, or Firm* — Muncy, Geissler, Olds & Lowe, P.C.

(57) ABSTRACT

A semiconductor memory structure includes a semiconductor substrate including an active region and a chop region. The semiconductor memory structure also includes an isolation structure disposed in the chop region, a first gate structure extending at least through the isolation structure in the chop region, and a second gate structure extending at least through the active region. The semiconductor memory structure also includes a doped region disposed in the active region. A first distance between the doped region and the first gate structure is shorter than a second distance between the doped region and the second gate structure.

16 Claims, 12 Drawing Sheets

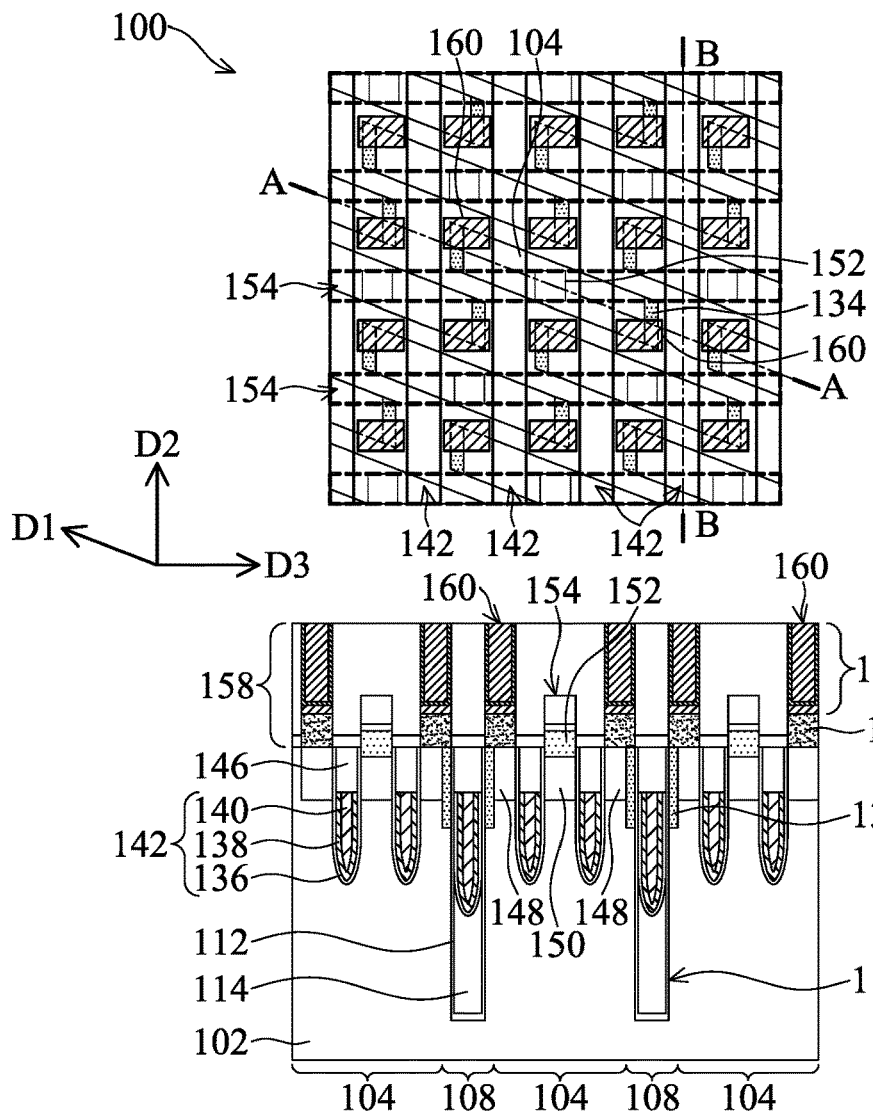
FIG. 1K
FIG. 1K-1
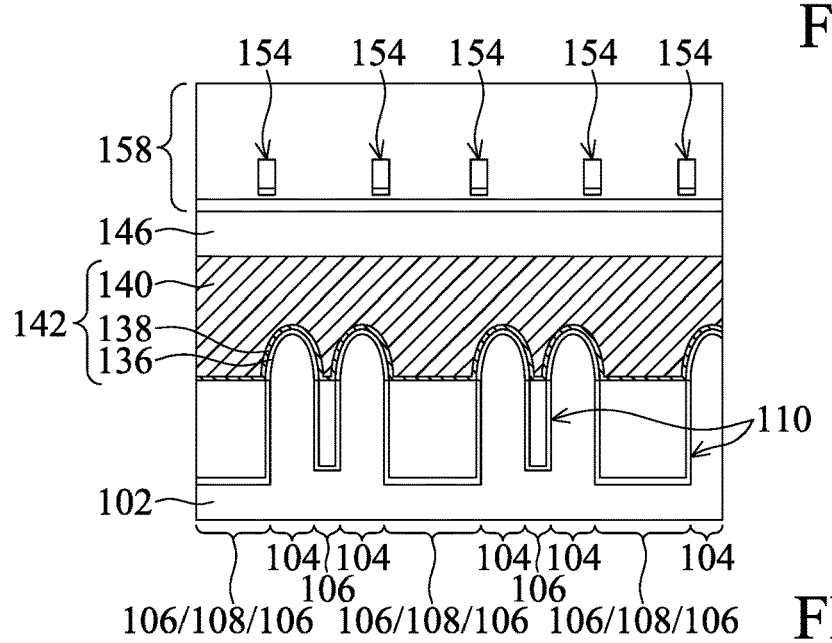
FIG. 1K-2

SEMICONDUCTOR MEMORY STRUCTURE AND METHOD FOR FORMING THE SAME

BACKGROUND

Field of the Disclosure

The present disclosure relates to a method for forming a semiconductor memory structure, and in particular, it relates to Dynamic Random Access Memory.

Description of the Related Art

Dynamic Random Access Memory (DRAM) devices are widely used in consumer electronic products. In order to increase element density in a DRAM device and improve its overall performance, existing technologies for fabricating DRAM devices continue to focus on scaling down the size of the elements. However, in scaling down the size of the minimum elements, new challenges arise, for example, improving source/drain junction leakage. Therefore, there is a need in the industry to improve the method of fabricating DRAM devices to overcome problems caused by scaling down the size of the elements.

SUMMARY

In some embodiments of the disclosure, a semiconductor memory structure is provided. The semiconductor memory structure includes an active region and a chop region. The semiconductor memory structure also includes an isolation structure disposed in the chop region, a first gate structure extending at least through the isolation structure in the chop region, and a second gate structure extending at least through the active region. The semiconductor memory structure also includes a doped region disposed in the active region. A first distance between the doped region and the first gate structure is shorter than a second distance between the doped region and the second gate structure.

In some embodiments of the disclosure, a semiconductor memory structure is provided. The semiconductor memory structure includes an active region of a semiconductor substrate, and a source/drain region disposed in the active region. The source/drain region has a first electrically conductive type. The semiconductor memory structure also includes an isolation structure surrounding the active region, a first gate structure embedded in the isolation structure, and a doped region disposed in the active region. The doped region has a second electrically conductive type that is the opposite of the first electrically conductive type. The doped region is located between the source/drain region and the first gate structure.

In some embodiments of the disclosure, a method for forming a semiconductor memory structure is provided. The method includes providing a semiconductor substrate that includes a chop region and an active region, forming a first trench through the chop region and a second trench through the active region, and forming a patterned mask layer to cover a portion of the second trench through the active region. The patterned mask layer has an opening exposing a portion of the first trench through the chop region. The method also includes performing an ion implantation process using the patterned mask layer to form a doped region in the active region, and forming a first gate structure in the first trench and a second gate structure in the second trench.

BRIEF DESCRIPTION OF THE DRAWINGS

The present disclosure can be further understood by reading the subsequent detailed description and examples with references made to the accompanying drawings, wherein:

FIGS. 1A through 1K illustrate plan views of forming a semiconductor memory structure at various stages, in accordance with some embodiments of the present disclosure.

FIGS. 1A-1 through 1K-1 and FIGS. 1A-2 through 1K-2 illustrate cross-sectional views of forming a semiconductor memory structure at various stages, in accordance with some embodiments of the present disclosure.

FIG. 1K-3 is an enlarged view of FIG. 1K-2 to illustrate additional details of a semiconductor memory structure.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure. The thickness of the layers and regions in the figures may be enlarged for clarity, and the same or similar reference numbers in the figures are denoted as the same or similar elements.

FIGS. 1A through 1K illustrate plan views of forming a semiconductor memory structure at various stages, in accordance with some embodiments of the present disclosure. For ease of illustration, FIGS. 1A through 1K illustrate reference directions, in that a first direction D1 is a channel extending direction, a second direction D2 is a word-line extending direction (or a gate extending direction), and a third direction D3 is a bit-line extending direction. The first direction D1 and the second direction D2 intersect at an acute angle that is in a range from about 10 degrees to about 80 degrees. The second direction D2 is substantially perpendicular to the third direction D3.

FIGS. 1A through 1K further illustrate reference cross-sections, in that cross-section A-A is a plane which is parallel with the longitudinal axis of an active region (i.e., the first direction D1) and passes through an active region, and cross-section B-B is a plane which is parallel with the longitudinal axis of a gate structure (i.e., the second direction D2) and passes through a gate structure.

Figure 1A:
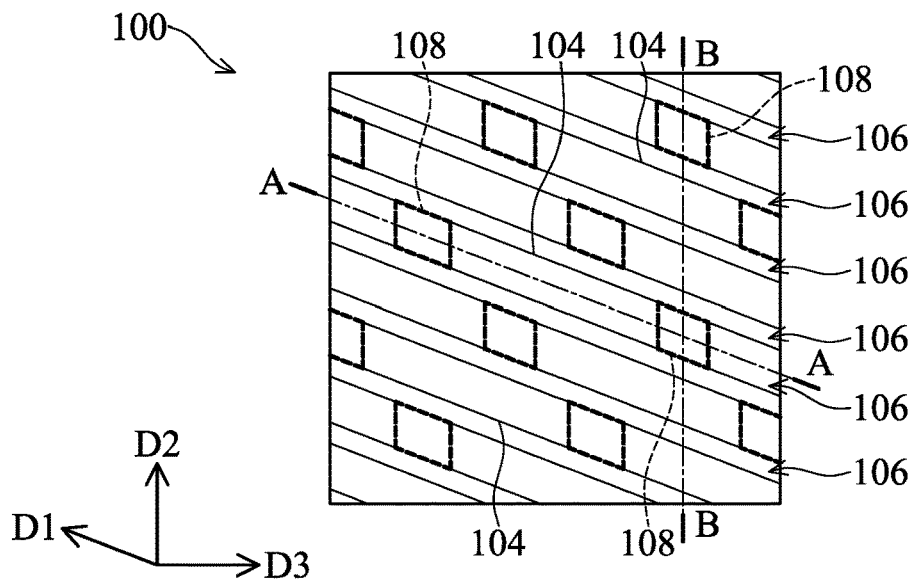
Figures 1, 1A:
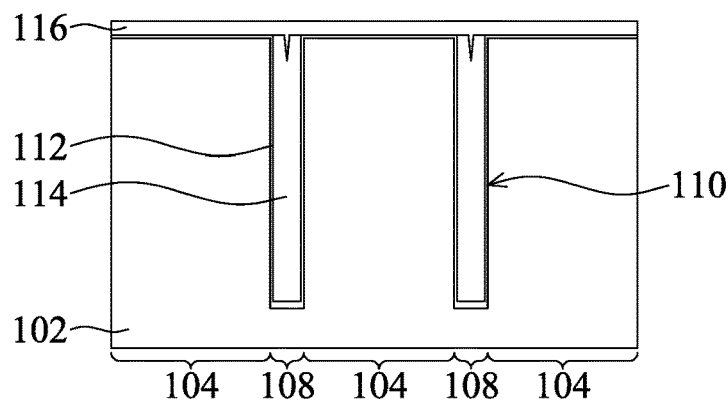
Figures 1, 1A, 2:
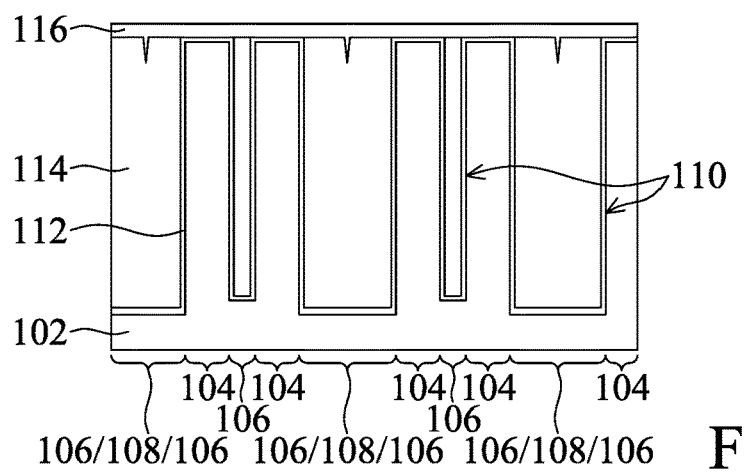
Figure 1B:
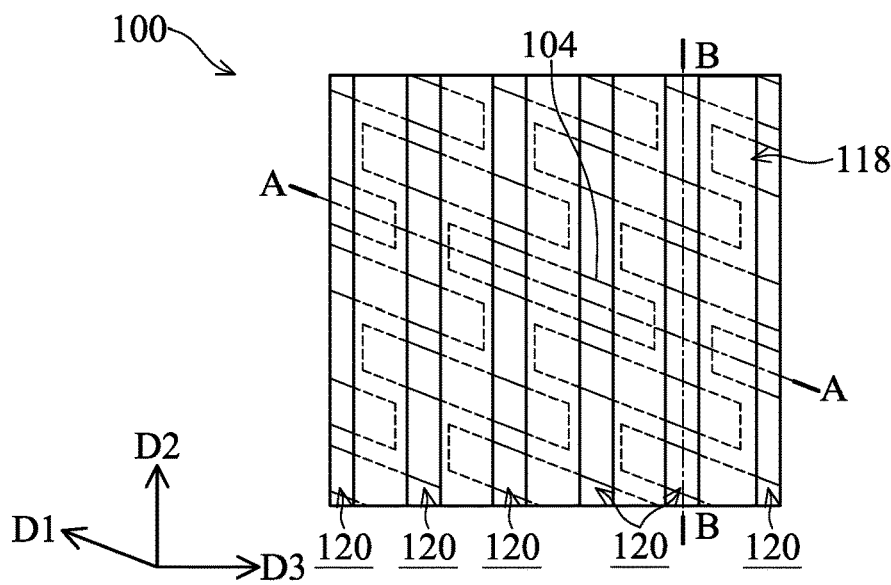
Figures 1, 1B:
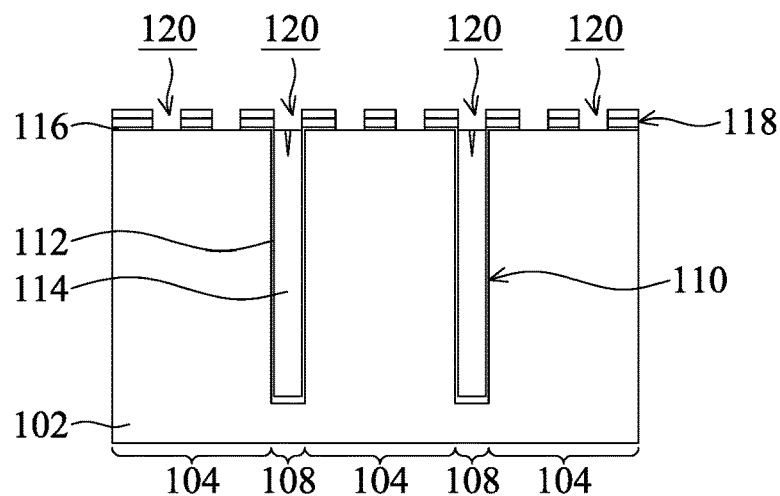
Figures 1, 1B, 2:
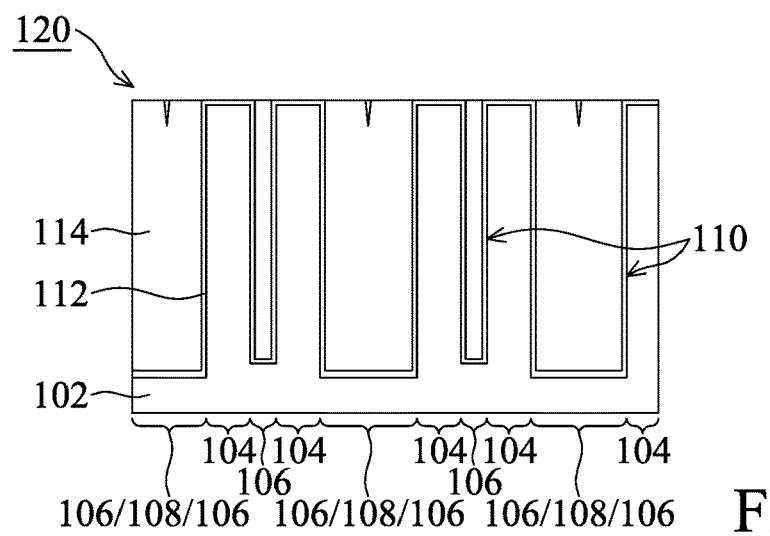
Figure 1C:
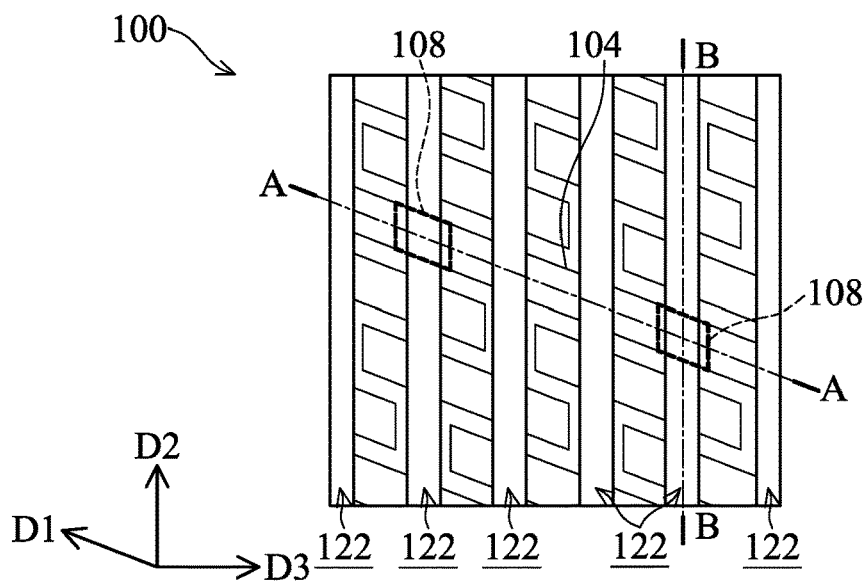
Figures 1, 1C:
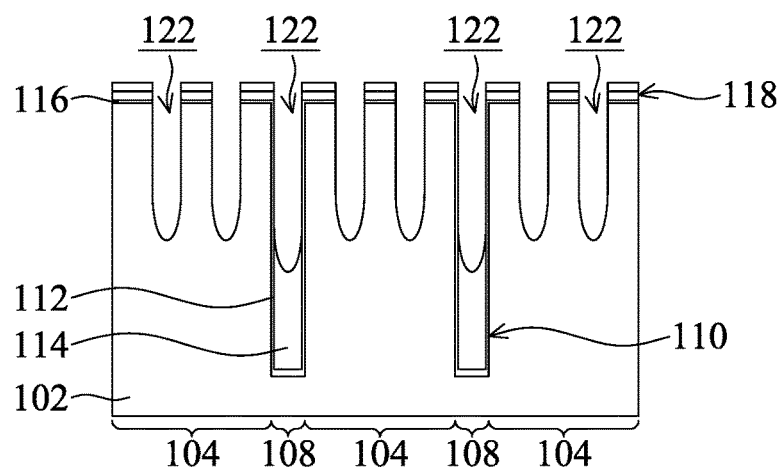
Figures 1, 1C, 2:
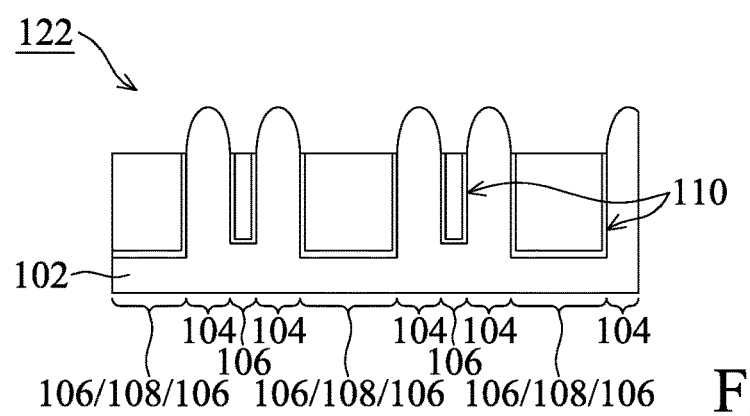
Figure 1D:
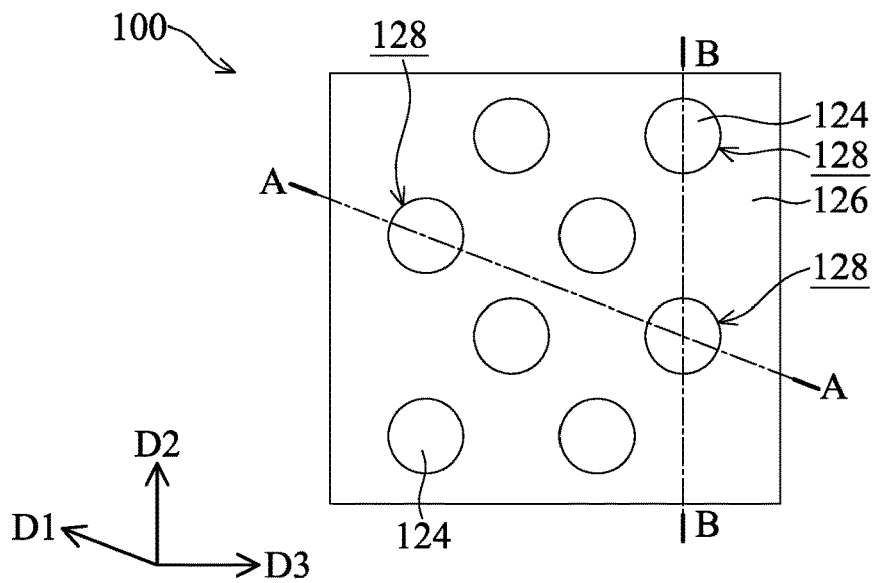
Figures 1, 1D:
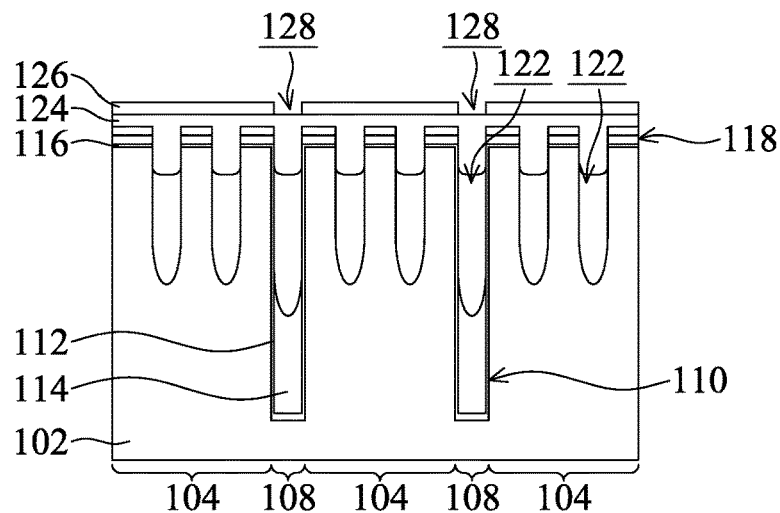
Figures 1, 1D, 2:
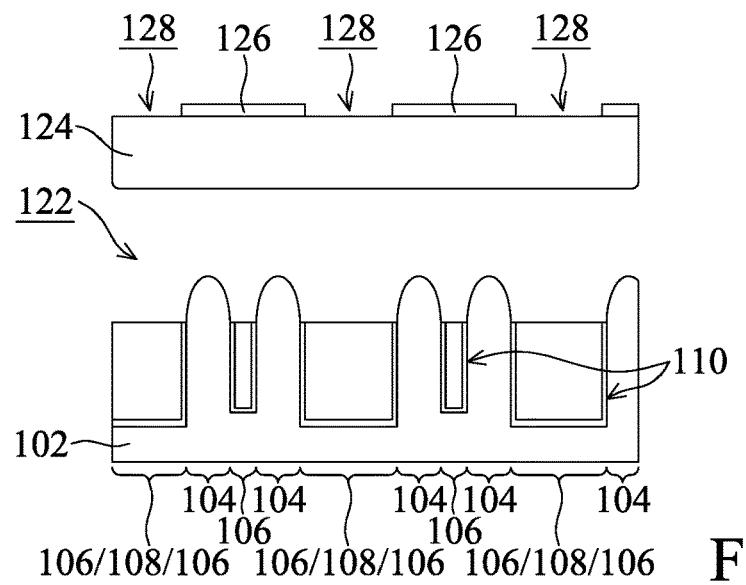
Figure 1E:
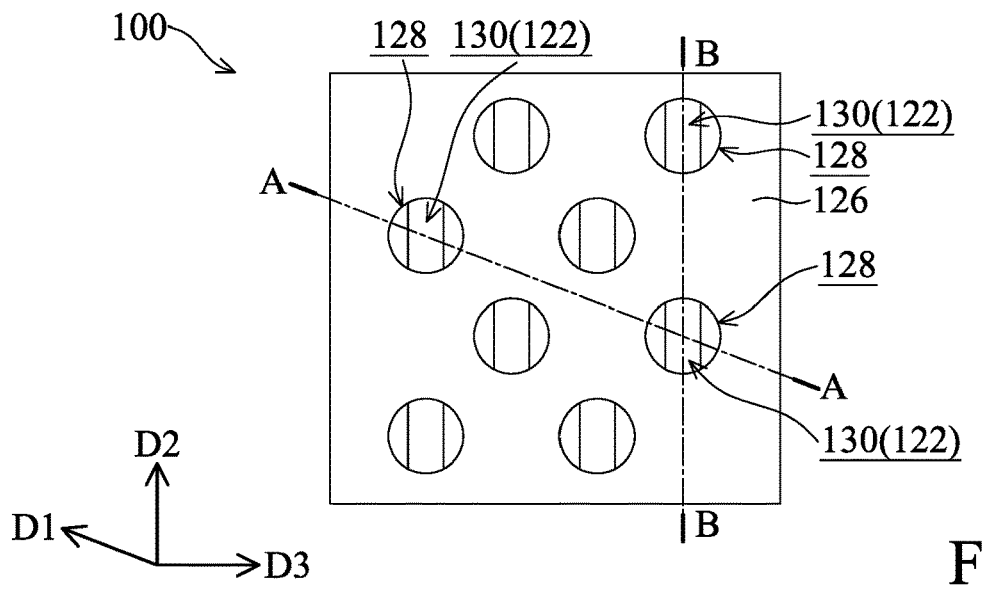
Figures 1, 1E:
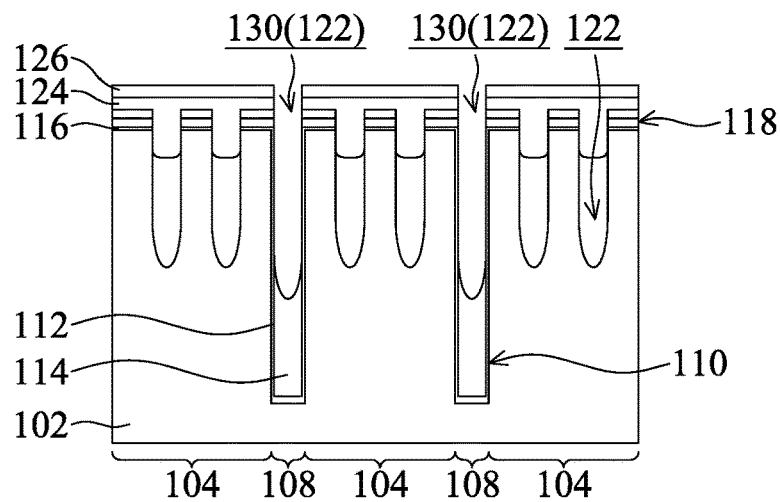
Figures 1, 1E, 2:
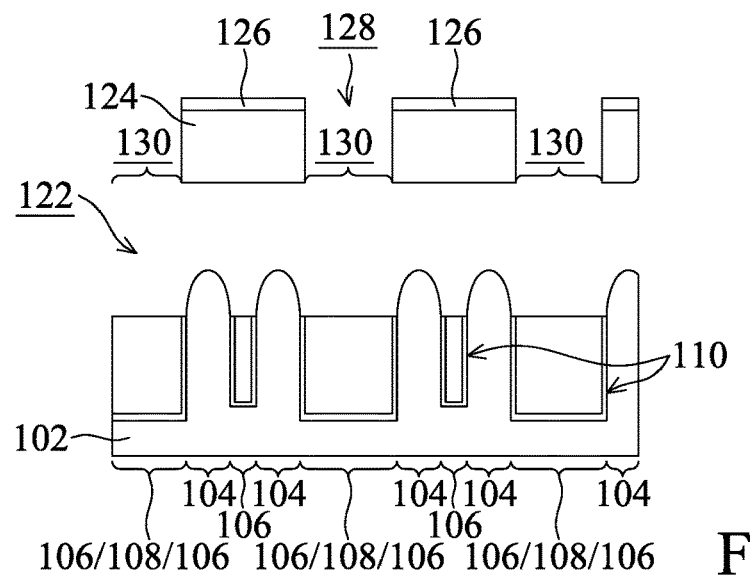
Figure 1F:
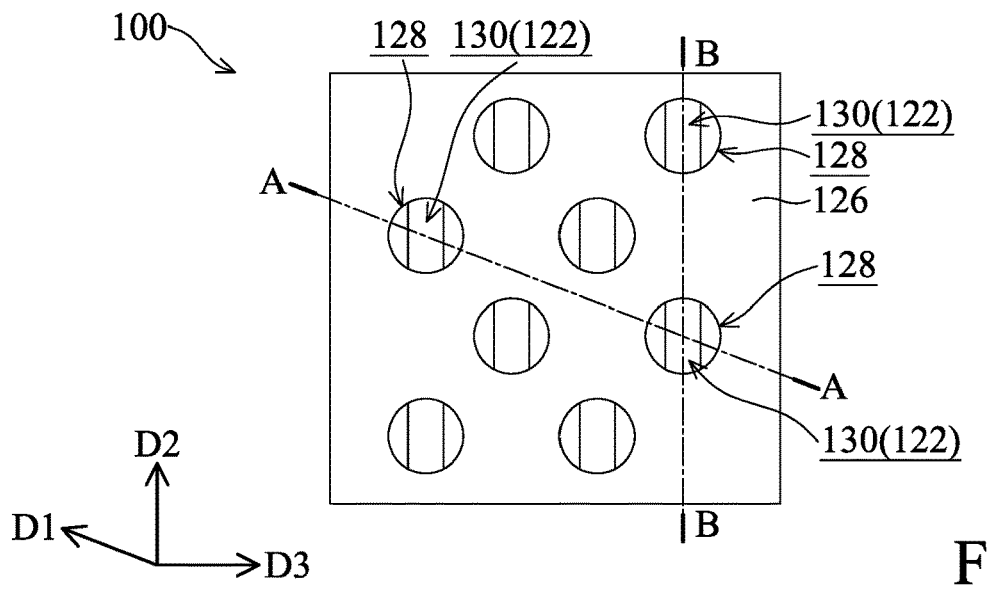
Figures 1, 1F:
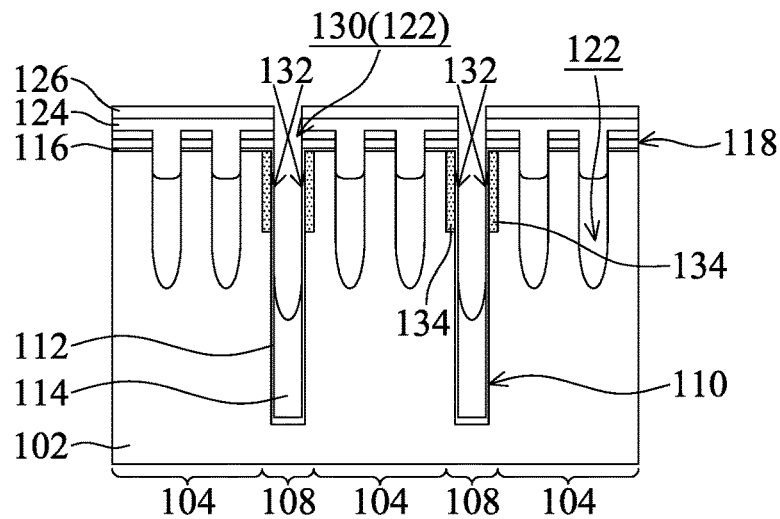
Figures 1, 1F, 2:
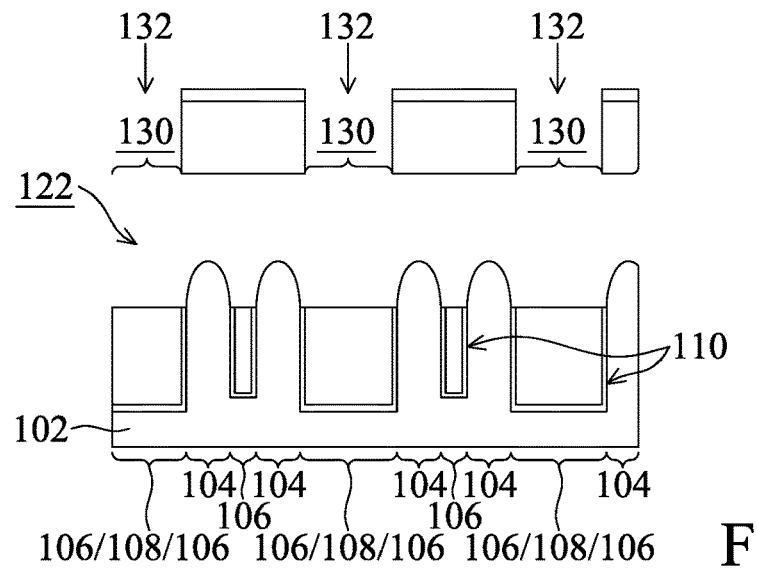
Figure 1G:
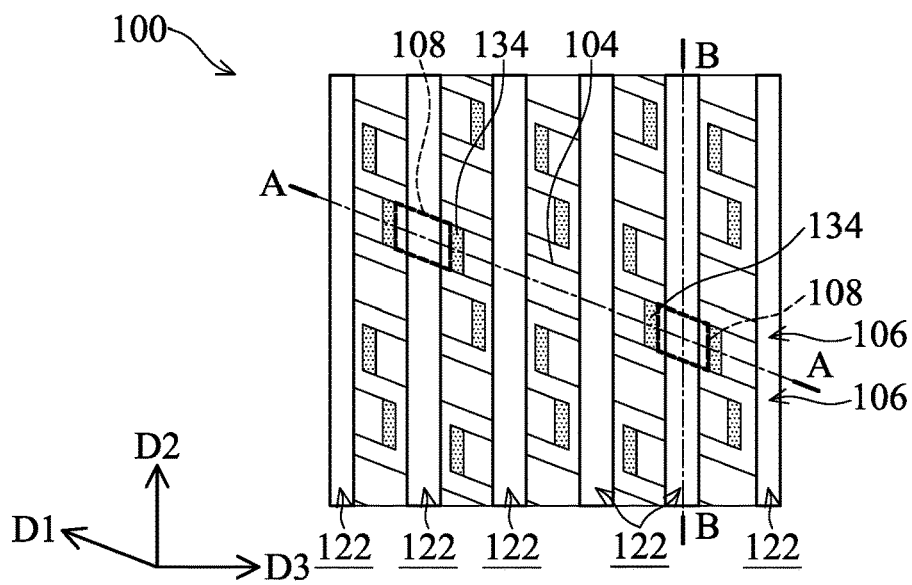
Figures 1, 1G:
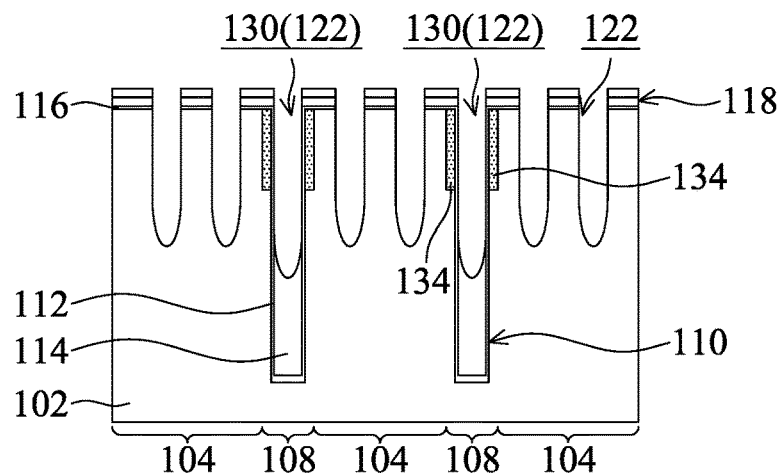
Figures 1, 1G, 2:
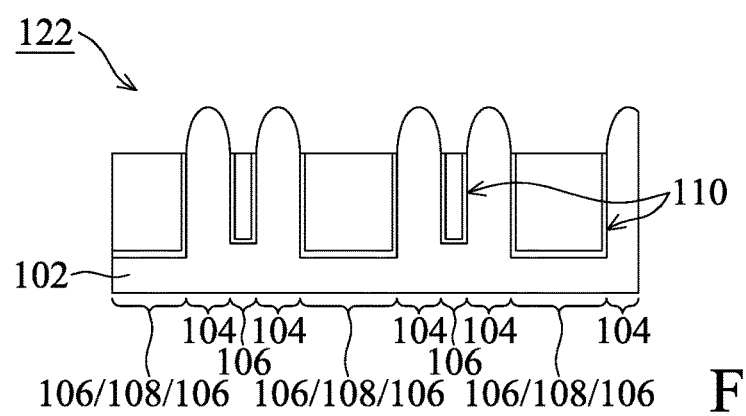
Figure 1H:
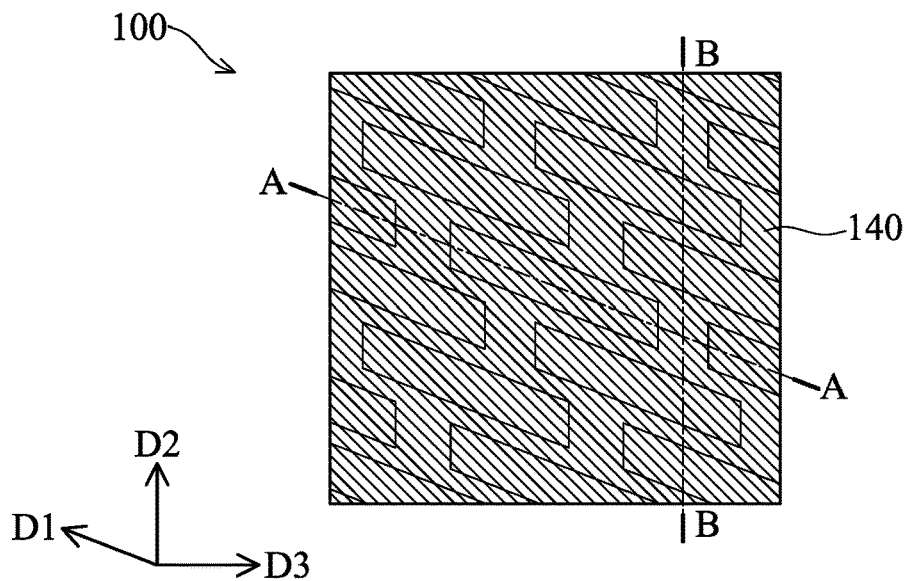
Figures 1, 1H:
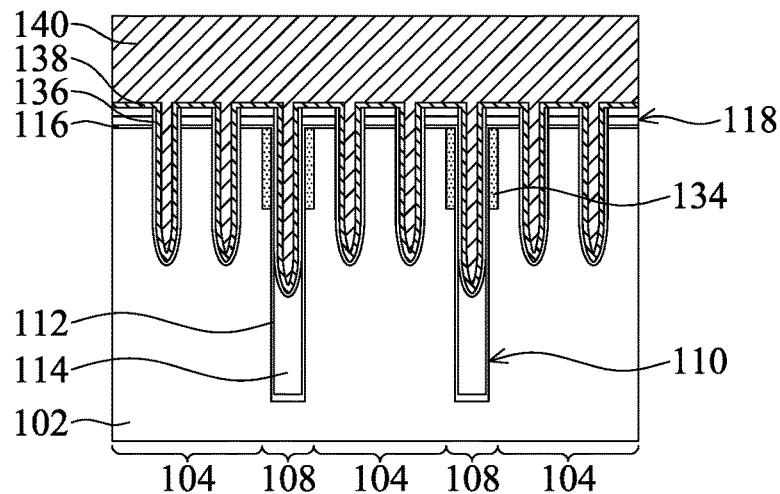
Figures 1, 1H, 2:
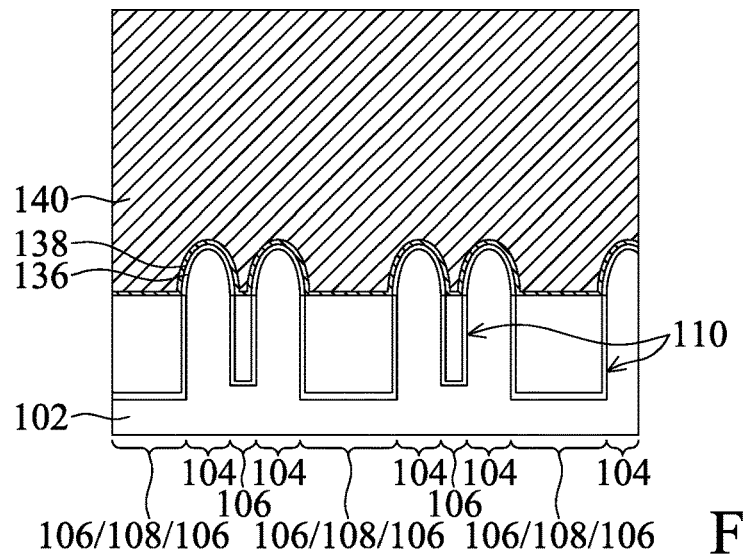
Figure 1I:
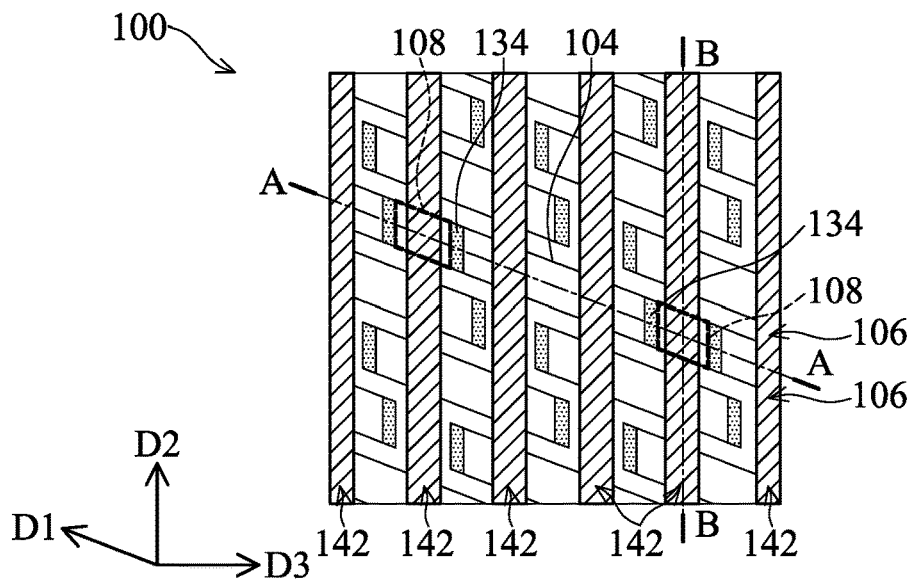
Figures 1, 1I:
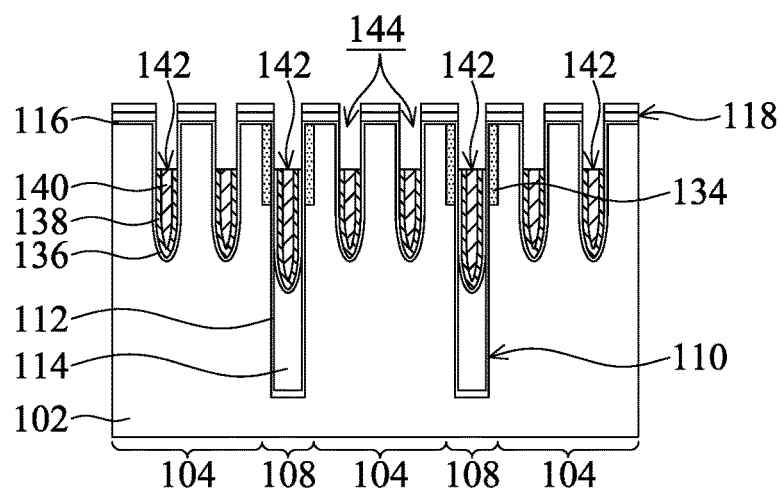
Figures 1, 1I, 2:
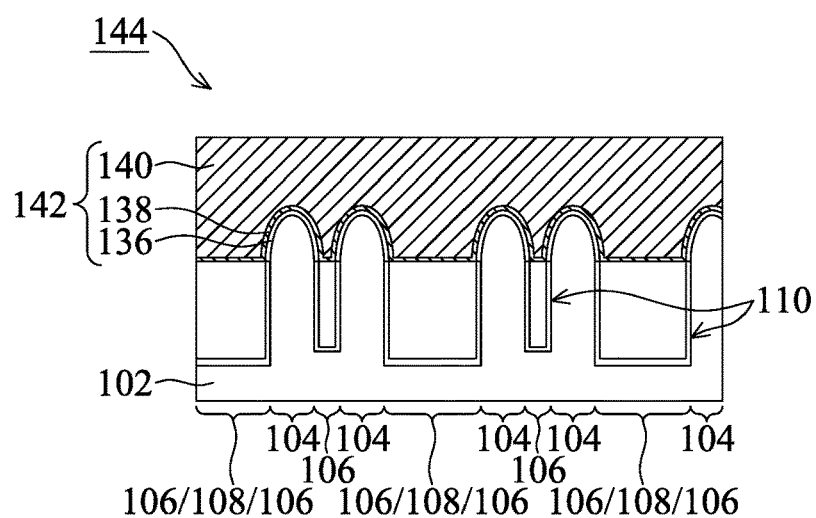
Figure 1J:
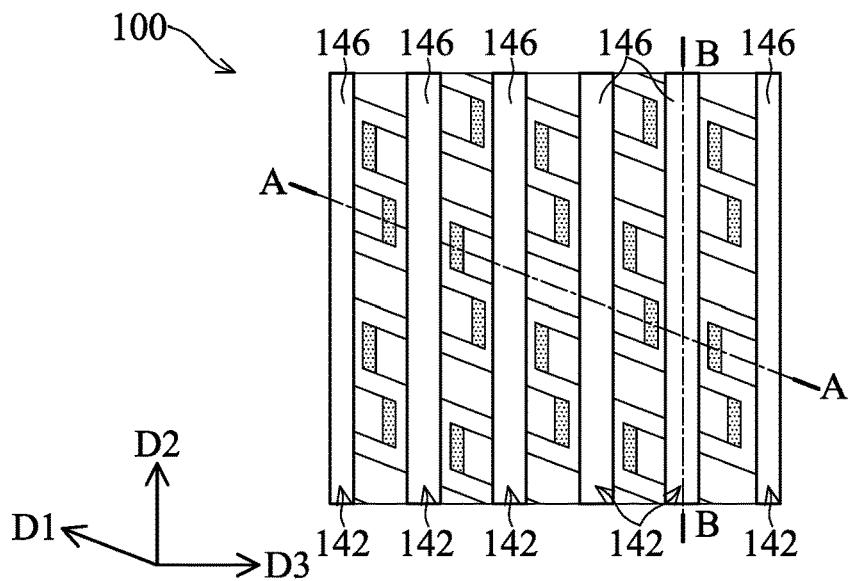
Figures 1, 1J:
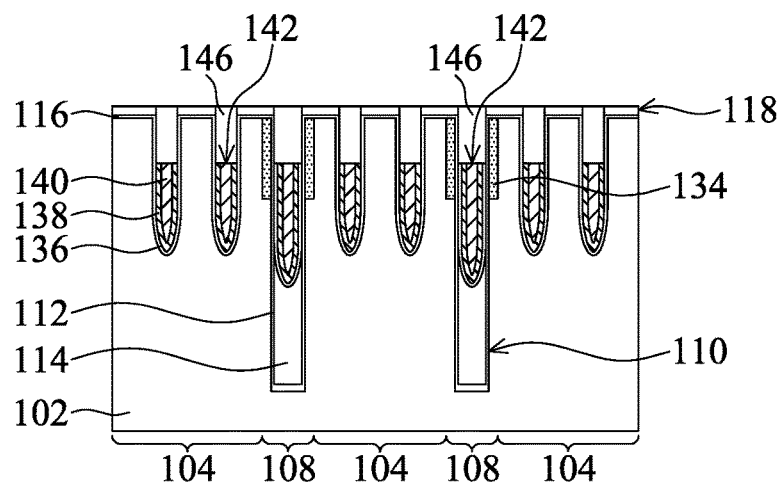
Figures 1, 1J, 2:
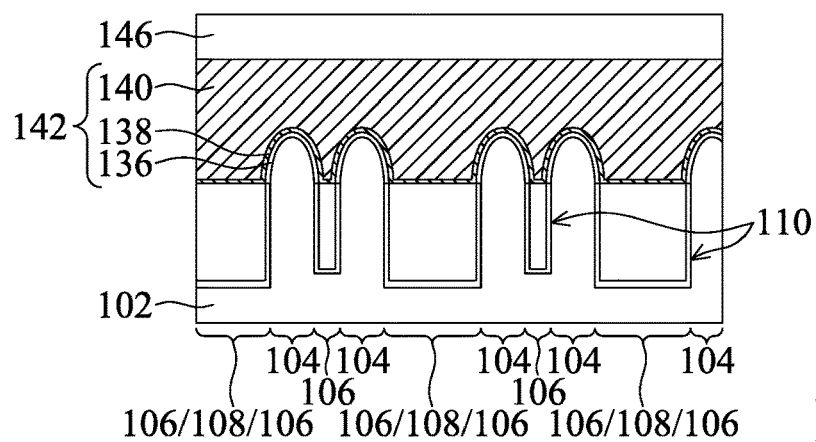
Figures 1, 1K, 2, 3:
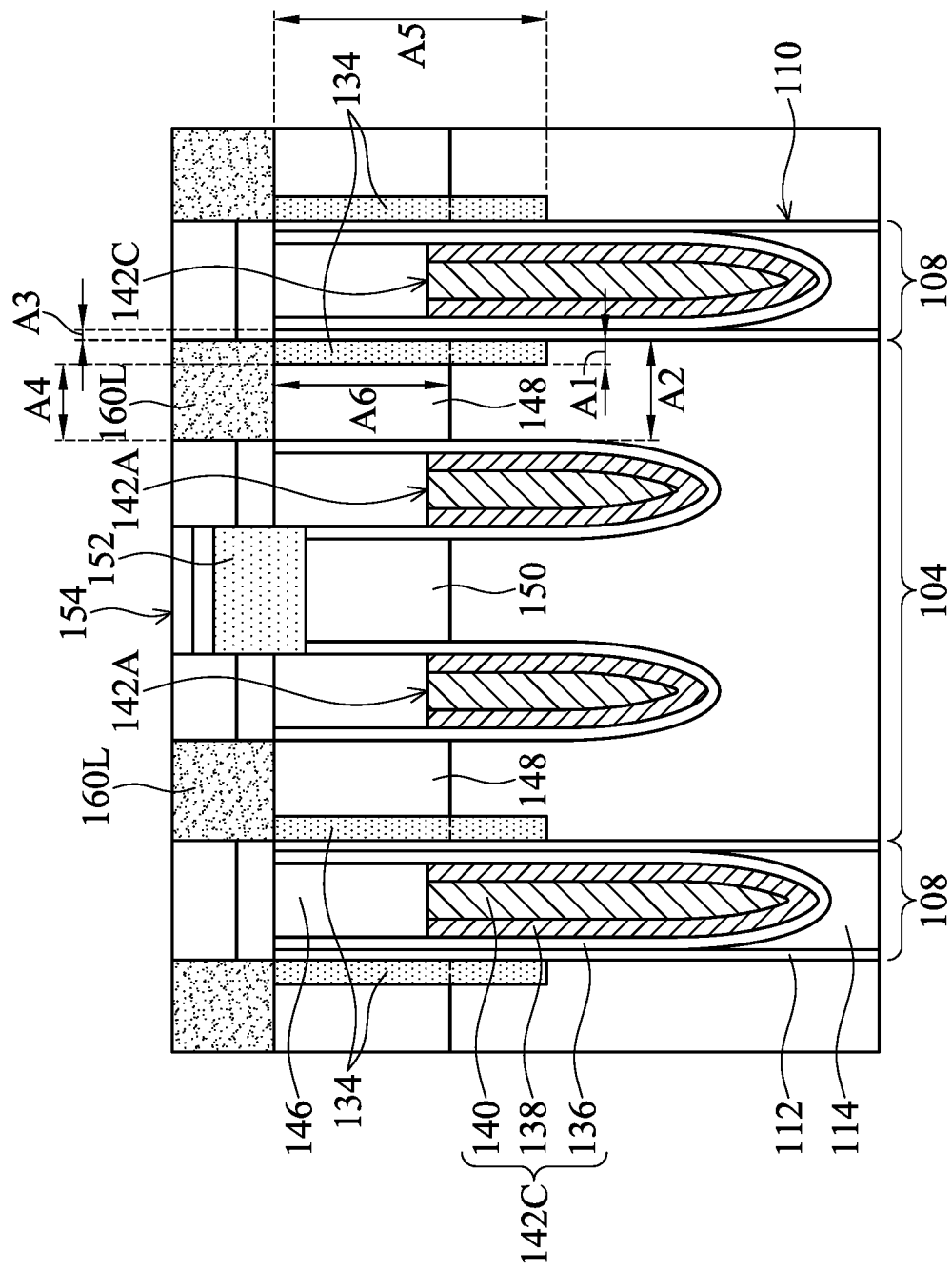

FIGS. 1A-1 through 1K-1 illustrate cross-sectional views of semiconductor memory structures taken along cross-section A-A shown in FIGS. 1A through 1K. FIGS. 1A-2 through 1K-2 illustrate cross-sectional views of semiconductor memory structures taken along cross-section B-B shown in FIGS. 1A through 1K.

A semiconductor memory structure 100 is provided. The semiconductor memory structure 100 includes a semiconductor substrate 102, as shown in FIGS. 1A, 1A-1 and 1A-2. The semiconductor substrate 102 includes active regions 104, isolation regions 106, and chop regions 108. The active regions 104 are semiconductor blocks that extend along the first direction D1. Each of the active regions 104 is defined by two isolation regions 106 and two chop regions 108. An isolation structure 110 is formed in the isolation regions 106 and the chop regions 108, thereby surrounding and electrically isolating the active regions 104.

The isolation regions 106 extend along the first direction D1 and are spaced out from one another in the second direction D2, thereby dividing the semiconductor substrate 102 into multiple semiconductor strips (not shown). The chop regions 108 (denoted by a broken line) are disposed corresponding to the semiconductor strips and cut the semiconductor strips into multiple active regions 104. Neighboring chop regions 108 arranged in the second direction D2 may be staggered with or do not overlaps with one another.

In some embodiments, the semiconductor substrate 102 may be an elemental semiconductor substrate, such as a silicon substrate or a germanium substrate; a compound semiconductor substrate, such as a silicon carbide substrate or a gallium arsenide substrate. In some embodiments, the semiconductor substrate 102 may be a semiconductor-on-insulator (SOI) substrate.

The isolation structure 110 extends downwardly from the upper surface of the semiconductor substrate 102. The formation of the isolation structure 110 may include forming trenches corresponding to the isolation regions 106 in the semiconductor substrate 102 using a first patterning process (including photolithography and etching processes) to define multiple semiconductor strips, and then forming trenches corresponding to the chop regions 108 using a second patterning process (including photolithography and etching processes) to cut the semiconductor strips into multiple active regions 104.

The formation of the isolation structure 110 may include forming a lining layer 112 along the sidewalls and the bottom surfaces of the trenches and along the upper surface of the semiconductor substrate 102, and then forming insulating material 114 to overfill the remainder of the trenches. The insulating material 114 is nested with the lining layer 112. The lining layer 112 is made of dielectric material such as silicon oxide (SiO), silicon nitride (SiN), silicon oxynitride (SiON), another suitable material, and/or a combination thereof. The insulating material 114 is made of dielectric material such as silicon nitride (SiN), silicon oxynitride (SiON), silicon oxide (SiO), another suitable material, and/or a combination thereof. The insulating material 114 and the lining layer 112 may be made of different materials. For example, the lining layer 112 is a silicon oxide layer, and the insulating material 114 is a silicon nitride layer.

The formation of the isolation structure 110 may also include performing a planarization process such as an etching back process to remove the insulating material 114 formed over the semiconductor substrate 102 until the lining layer 112 is exposed. After the planarization, a seam may be formed at the upper surface of the insulating material 114, especially at the upper surface of the insulating material 114 in a wider trench. A dielectric layer 116 may be formed over the upper surface of the semiconductor substrate 102 and fills the seal. The dielectric layer 116 may a silicon oxide layer which is formed using atomic layer deposition (ALD).

A patterned mask layer 118 is formed over the upper surface of the semiconductor substrate 102, as shown in FIGS. 1B, 1B-1 and 1B-2. The patterned mask layer 118 has opening patterns 120. The opening patterns 120 extend along the second direction D2. In some embodiments, the patterned mask layer 118 may be a hard mask structure which is made of one or more dielectric materials. The one or more dielectric materials may be silicon oxide (SiO), silicon nitride (SiN), silicon oxynitride (SiON), another suitable material, and/or a combination thereof. During forming the patterned mask layer 118, portions of the dielectric layer 116 exposed from the opening patterns 120 may be removed.

An etching process is performed on the semiconductor memory structure 100 using the patterned mask layer 118 to remove portions of the semiconductor memory structure 100 uncovered by the patterned mask layer 118. The opening patterns 120 of the patterned mask layer 118 are transferred into the active regions 104 of the semiconductor substrate 102 and the isolation structure 110, thereby forming trenches 122, as shown in FIGS. 1C, 1C-1 and 1C-2. The etching depth of the trenches 122 in the active regions 104 may be different than the etching depth of the trenches 122 in the isolation structure 110. The trenches 122 extend along the second direction D2 and arranged in the third direction D3. The trenches 122 extend alternatingly through the active regions 104 and the isolation structure 110. Two trenches 122 extend through one active region 104, and two trenches 122 extend through chop regions 108 on the opposite sides of this active region 104.

The trenches 122 have a dimension along the third direction D3 that is required to be less than the dimension of the chop region 108 along the third direction D3. Portions of the insulating material 114 are removed by the etching process for forming the trenches 122. In the chop regions 108, the lining layer 112 of the isolation structure 110 is exposed from the trenches 122 after the etching process. If the dimension of the trenches 122 along the third direction D3 is too large, the lining layer 112 may be too thin or completely removed after the etching process, thereby negatively affecting the electrical performance of a resulting semiconductor memory device (e.g., conductive current). If the dimension of the trenches 122 along the third direction D3 is too small, the amount of the electrode material filled in the trenches 122 may be not enough.

A fill material 124 is formed over the semiconductor memory structure 100, as shown in FIGS. 1D, 1D-1 and 1D-2. The fill material 124 is formed over the patterned mask layer 118 and seals the trenches 122. Upper portions of the trenches 122 are filled with the fill material 124, and lower portions of the trenches 122 remain unfilled. In some embodiments, the fill material 124 is made of carbon containing material such as diamond-like carbon (DLC), high selectivity transparency (HST) carbon film, or the like. The fill material 124 is configured to provide a substantially planar upper surface on which a patterned mask layer is to be formed.

Next, a patterned mask layer 126 is formed over the fill material 124. The patterned mask layer 126 has opening patterns 128 which correspond to the chop regions 108 of the semiconductor substrate 102 and expose the fill material 124. The patterned mask layer 126 may be a patterned photoresist layer. The photolithography process for forming the patterned mask layer 126 may use the same reticle as that used in the photolithography process for forming the chop region 108. In some other embodiments, the patterned mask layer 126 is a patterned hard mask layer.

An etching process is performed on the fill material 124 using the patterned mask layer 126 to remove portions of the fill material 124 exposed from the opening patterns 128, thereby opening the trenches 122 which is previously sealed by the fill material 124. After the etching process, portions (labeled as 130) of the trenches 122 through the chop regions 108 are exposed from the fill material 124 and the patterned mask layer 126, as shown in FIGS. 1E, 1E-1 and 1E-2.

An ion implantation process is performed on the semiconductor memory structure 100 using the patterned fill material 124 and the patterned mask layer 126 to form doped regions 134 in the active regions 104, as shown in FIGS. 1F, 1F-1 and 1F-2. A tilt angle of the ion implantation process may be in a range from about 5 degrees to about 20 degrees. During the ion implantation process, dopants 132 pass through the opening patterns 128 of the patterned mask layer 126 and the opening patterns of the patterned fill material 124, penetrates through the lining layer 112 of the isolation structure 110, and then are implanted into the semiconductor material of the active regions 104, thereby forming the doped regions 134 at the sides of the active regions 104 facing the chop regions 108. The dopants 132 may be p-type dopants (such as boron or $BF_2$) or n-type dopants (such as phosphor or arsenic).

The doped regions 134 are configured to balance conductive carriers induced by passing word lines. This will be described in detail later. The electrically conductive type of the doped regions 134 may be the same as the electrically conductive type of the active regions 104 of the semiconductor substrate 102, for example, both are p-type. The doping concentration of the doped regions 134 is greater than the doping concentration of the active regions 104 of the semiconductor substrate 102, for example, by one to two orders.

After the ion implantation process, the patterned mask layer 126 and the fill material 124 are removed using an ashing process or an etching process to expose the patterned mask layer 118 and open remaining portions of the trenches 122, as shown in FIGS. 1G, 1G-1 and 1G-2.

A gate dielectric layer 136, a gate lining layer 138 and a gate electrode layer 140 are sequentially formed over the semiconductor memory structure 100, as shown in FIGS. 1H, 1H-1 and 1H-2. The gate dielectric layer 136 is formed along the sidewalls of the patterned mask layer 118 and the sidewalls of and the bottom surfaces of the trenches 122 to partially fill the trenches 122. In some embodiments, the gate dielectric layer 136 is made of silicon oxide, silicon nitride, silicon oxynitride, high-k dielectric material, and/or a combination thereof. In some embodiments, the gate dielectric layer 136 is formed using in-situ steam generation (ISSG), ALD, chemical vapor deposition (CVD), a combination thereof.

The gate lining layer 138 is formed over the gate dielectric layer 136 and partially fills the trenches 122. In some embodiments, the gate lining layer 138 is made of titanium nitride (TiN), tungsten nitride (WN), tantalum nitride (TaN), another suitable material, and/or a combination thereof. In some embodiments, the gate lining layer 138 is deposited using physical vapor deposition (PVD) and/or ALD.

The gate electrode layer 140 is formed over the gate lining layer 138 and overfills remainders of the trenches 122. In some embodiments, the gate electrode layer 140 is made of metal material such as tungsten (W), aluminum (Al), copper (Cu), cobalt (Co), ruthenium (Ru), another suitable material, and/or a combination thereof. In some embodiments, the gate electrode layer 140 is deposited using PVD, CVD, and/or ALD.

In some embodiments, an etching back process may be performed on the gate electrode layer 140 and the gate lining layer 138 to form recesses 144 that extend into the semiconductor substrate 102, as shown in FIGS. 1I, 1I-1 and 1I-2. After the etching process, gate structures 142 are formed. The gate structures 142 may be used as word lines of a resulting semiconductor memory device and also referred to as buried word lines (BWL).

Each of the gate structures 142 extends alternatingly through the active regions 104 and the isolation structure 110. Two gate structures 142 extend through a single active region 104, and two gate structures 142 extend through chop regions 108 on the opposite sides of this active region 104. The gate structures 142 include the gate dielectric layer 136, the gate lining layer 138 and the gate electrode layer 140. The gate lining layer 138 has a U-shaped profile and the lines between the gate dielectric layer 136 and the gate electrode layer 140. The gate electrode layer 140 is nested within the gate lining layer 138. In addition, the upper surfaces of the gate lining layer 138 and the gate electrode layer 140 are located at a higher level than the bottom surfaces of the doped regions 134.

A capping layer 146 is formed in the recesses 144, as shown in FIGS. 1J, 1J-1 and 1J-2. In some embodiments, the capping layer 146 is made of silicon oxide, silicon nitride, silicon oxynitride, another suitable material, and/or a combination thereof. The formation of the capping layer 146 may include depositing a dielectric material to fill the recess 144, and then performing a planarization process to remove the dielectric materials formed over the upper surface of the patterned mask layer 118.

In some embodiments, source/drain regions 148 and 150 are formed in the active regions 102 of the semiconductor substrate 102 using an ion implantation process, as shown in FIG. 1K-1. The source/drain region 150 is located at the center of the active region 104, and the source/drain regions 148 are located at two ends of the active region 104. The source/drain regions 148 and 150 and portions of the gate structures 142 extending through the active regions 104 combine to form transistors, e.g., n-type transistors or p-type transistors, for a resulting semiconductor memory device.

The source/drain regions 148 and 150 are doped and PN junctions are formed between the active regions 104 and the source/drain regions 148 (or the source/drain regions 150). The electrically conductive type of the source/drain regions 148 and 150 is opposite to the electrically conductive type of the active regions 104 of the semiconductor substrate 102 and the electrically conductive type of the doped regions 134. For example, the electrically conductive type of the active regions 104 and the doped regions 134 is p-type while the electrically conductive type of the source/drain regions 148 and 150 is n-type. The doping concentration of the source/drain regions 148 and 150 is greater than the doping concentration of the doped regions 134, for example, by one to two orders. In addition, the bottom surfaces (i.e., the PN junctions described above) of the source/drain regions 148 and 150 are located at a lower level than the upper surfaces of the gate lining layer 138 and the gate electrode layer 140.

A dielectric structure 158 is formed over the semiconductor memory structure 100, and conductive features are formed in the dielectric structure 158 to electrically couple the source/drain regions 148 and 150. For example, as shown in FIGS. 1K, 1K-1 and 1K-2, contact plugs 152 are formed on the source/drain regions 150; bit lines 154 are formed over the contact plugs 152; and contact plugs 160 are formed on the source/drain regions 148 and the doped regions 134. Portions of the dielectric layer 116, the patterned mask layer 118 and the capping layer 146 over the upper surface of the semiconductor substrate 102 may be removed during forming the dielectric structure 158 and these conductive features.

In some embodiments, the dielectric structure 158 includes multiple dielectric layers which are made of dielectric materials such as silicon oxide, silicon nitride, silicon oxynitride, another suitable material, and/or a combination thereof.

In some embodiments, the contact plugs 152 partially extend into the semiconductor substrate 102 and land on the source/drain regions 150. The contact plugs 152 are made of semiconductor material such as polysilicon.

In some embodiments, the bit lines 154 extend along the third direction D3 and are electrically coupled to the source/drain regions 150 through the contact plugs 152. The bit lines 154 are made of metal of metal nitride such as tungsten (W), aluminum (Al), copper (Cu), titanium (Ti), tantalum (Ta), titanium nitride (TiN), tantalum nitride (TaN), another suitable material, multilayers thereof, and/or a combination thereof. A silicide layer may be formed between the bit lines 154 and the contact plugs 152.

In some embodiments, the contact plugs 160 land on the source/drain regions 148 and the doped regions 134. The contact plugs 160 may include lower portions 160L and upper portions 160U. For example, the lower portions 160L of the contact plugs 160 are made of semiconductor material such as polysilicon. The upper portions 160U of the contact plugs 160 are made of metal of metal nitride such as tungsten (W), aluminum (Al), copper (Cu), titanium (Ti), tantalum (Ta), titanium nitride (TiN), tantalum nitride (TaN), another suitable material, multilayers thereof, and/or a combination thereof. A silicide layer may be formed between the lower portion 160L and the upper portion 160U of the contact plug 160.

FIG. 1K-3 is an enlarged view of FIG. 1K-2 to illustrate additional details of the semiconductor memory structure 100. As shown in FIG. 1K-3, a portion of the gate structure 142 through the isolation structure 110 in the chop region 108 is denoted as 142C, and a portion of the gate structure 142 through the active region 104 is denoted as 142A. In some cases, during operation, the portion 142C (also referred to as a passing word line) of the gate structure 142 through the chop region 108 may induce conductive carriers (e.g., electrons or holes) in the neighboring active region 104 (or on the sidewall of the isolation structure 110), thereby forming a channel layer. This channel layer is undesirable. The undesirable channel layer may provide various leakage paths, for example, leakage from source/drain region 148 to the contact plug on the source/drain region 150, and/or to other conductive features, thereby leading to deterioration or loss of data stored in the semiconductor memory device.

In accordance with embodiments of the present disclosure, because the conductive carriers (e.g., electrons or holes) provided by the dopants of the doped regions 134 are opposite to the conductive carriers induced by the passing word lines 142C, the doped regions 134 can balance the conductive carriers induced by the passing word lines 142C. As a result, the possibility of the formation of leakage paths can be reduced. Therefore, the reliability and the manufacturing yield of the semiconductor memory device can be increased.

In some embodiments, the source/drain region 148 may be formed to overlap with a portion of the doped region 134 (the overlapping portion is represented by a broken line). The doped region 134 has a width A1 along the first direction D1. The source/drain region 148 has a width A2 along the first direction D1. The ratio of the width A1 of the doped region 134 to the width A2 of the source/drain region 148 is in a range from about 0.01 to about 0.05. If the ratio of the width A1 to the width A2 is too large, the doped region 134 may negatively affect the electrical performance of the semiconductor memory device (such as conductive current). If the ratio of the width A1 to the width A2 is too small, the doped region 134 may not be able to sufficiently balance the conductive carriers induced by the passing word line.

The doped region 134 is spaced apart from (the gate dielectric layer 136 of) the portion 142C of the gate structure 142 in the chop region 108 by a distance A3. The doped region 134 is spaced apart from (the gate dielectric layer 136 of) the portion 142A of the gate structure 142 in the active region 104 by a distance A4. The distance A3 is less than the distance A4. The ratio of the distance A3 to the distance A4 is in a range from about 0.01 to about 0.05. If the ratio of the distance A3 to the distance A4 is too large, the doped region 134 may negatively affect the electrical performance of the semiconductor memory device (such as conductive current). If the ratio of the distance A3 to the distance A4 is too small, the doped region 134 may not be able to sufficiently balance the conductive carriers induced by the passing word line.

The top surface of the doped region 134 is coplanar with the top surface of the capping layer 146. The bottom surface of the doped region 134 is located at a lower level than the bottom surface of the source/drain feature 148. That is, the depth A5 of the doped region 134 is greater than the depth A6 of the source/drain feature 148. The ratio of the depth A5 of the doped region 134 to the depth A6 of the source/drain region 148 is in a range from about 1.25 to about 1.5. If the ratio of the depth A5 to the depth A6 is too large, the dopants may be undesirably implanted in other areas of the semiconductor substrate 102 (such as a periphery area) during the ion implantation for forming the doped region 134. If the ratio of the depth A5 to the depth A6 is too small, the doped region 134 may not be able to sufficiently balance the conductive carriers induced by the passing word line.

Additional features may be formed over the semiconductor memory structure 100, thereby obtaining a semiconductor memory device. For example, capacitor structures (not shown) may be formed over the dielectric structure 158 and electrically coupled to the source/drain feature 148 through the contact plug 160. In some embodiments, the semiconductor memory device is DRAM.

As described above, the embodiments of the present disclosure utilize forming the doped region at the sides of the active region facing the passing word lines. The doped region can balance the conductive carriers induced by the passing word line, thereby reducing the possibility of the formation of leakage paths. Therefore, the reliability and the manufacturing yield of the semiconductor memory device can be increased.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor memory structure, comprising:
   a semiconductor substrate including an active region and a chop region;
   an isolation structure disposed in the chop region;
   a first gate structure extending at least through the isolation structure in the chop region;
   a second gate structure extending at least through the active region;
   a doped region disposed in the active region, wherein a first distance between the doped region and the first gate structure is shorter than a second distance between the doped region and the second gate structure;
   a source/drain region disposed in the active region and between the second gate structure and the isolation structure, wherein the doped region is located between the source/drain region and the isolation structure; and
   a contact plug disposed on the source/drain region and the doped region.

2. The semiconductor memory structure as claimed in claim 1, wherein the doped region has a first electrically conductive type, the source/drain region has a second electrically conductive type that is opposite the first electrically conductive type.

3. The semiconductor memory structure as claimed in claim 1, wherein a bottom surface of the doped region is lower than a bottom surface of the source/drain region.

4. The semiconductor memory structure as claimed in claim 1, wherein the isolation structure includes a lining layer and an insulating material disposed over the lining layer, wherein the lining layer of the isolation structure is located between the first gate structure and the doped region.

5. The semiconductor memory structure as claimed in claim 4, further comprising:
a capping layer disposed over the first gate structure, wherein the lining layer of the isolation structure is located between the capping layer and the doped region.

6. The semiconductor memory structure as claimed in claim 5, wherein a top surface of the doped region is coplanar with a top surface of the capping layer.

7. A semiconductor memory structure, comprising:
an active region of a semiconductor substrate;
a source/drain region disposed in the active region and having a first electrically conductive type;
an isolation structure surrounding the active region;
a first gate structure embedded in the isolation structure; and
a doped region disposed in the active region and having a second electrically conductive type that is the opposite of the first electrically conductive type, wherein the doped region is located between the source/drain region and the first gate structure, a depth of the doped region is greater than a depth of the source/drain region, and a doping concentration of the source/drain region is greater than a doping concentration of the doped region.

8. The semiconductor memory structure as claimed in claim 7, wherein a bottom surface of the doped region is lower than an upper surface of a gate electrode layer of the first gate structure.

9. A method for forming a semiconductor memory structure, comprising:
providing a semiconductor substrate, the semiconductor substrate including a chop region and an active region;
forming a first trench through the chop region and a second trench through the active region;
forming a patterned mask layer to cover a portion of the second trench through the active region, wherein the patterned mask layer has an opening exposing a portion of the first trench through the chop region;
performing an ion implantation process using the patterned mask layer to form a doped region in the active region; and
forming a first gate structure in the first trench and a second gate structure in the second trench.

10. The method for forming the semiconductor memory structure as claimed in claim 9, further comprising:
forming a fill material to seal the first trench and the second trench, wherein the patterned mask layer is formed over the fill material; and
etching the fill material using the patterned mask layer such that the portion of the first trench through the chop region is exposed from the fill material.

11. The method for forming the semiconductor memory structure as claimed in claim 9, further comprising:
forming an isolation structure in the chop region, wherein the first gate structure extends through the isolation structure in the chop region.

12. The method for forming the semiconductor memory structure as claimed in claim 11, wherein a dopant penetrates through the isolation structure and is implanted into the active region during the ion implantation process.

13. The method for forming the semiconductor memory structure as claimed in claim 11, wherein the isolation structure includes a lining layer and an insulating material disposed on the lining layer, and forming the first trench comprises etching the insulating material of the isolation structure to expose the lining layer of the isolation structure.

14. The method for forming the semiconductor memory structure as claimed in claim 9, further comprising:
forming a source/drain region in the active region, wherein the doped region has a first electrically conductive type, and the source/drain region has a second electrically conductive type that is the opposite of the first electrically conductive type.

15. The method for forming the semiconductor memory structure as claimed in claim 14, wherein a bottom surface of the doped region is lower than a bottom surface of the source/drain region.

16. The method for forming the semiconductor memory structure as claimed in claim 14, further comprising:
forming a contact plug landing on the source/drain region and the doped region.

* * * * *